United States Patent
Sayama et al.

(10) Patent No.: US 6,835,610 B2
(45) Date of Patent: Dec. 28, 2004

(54) METHOD OF MANUFACTURING SEMICONDUCTOR DEVICE HAVING GATE ELECTRODE WITH EXPANDED UPPER PORTION

(75) Inventors: Hirokazu Sayama, Tokyo (JP); Kazunobu Ohta, Tokyo (JP); Hidekazu Oda, Tokyo (JP); Kouhei Sugihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/452,309

(22) Filed: Jun. 3, 2003

(65) Prior Publication Data

US 2004/0043549 A1 Mar. 4, 2004

(30) Foreign Application Priority Data

Sep. 4, 2002 (JP) ........................... 2002-258683

(51) Int. Cl.[7] ............................................. H01L 21/336
(52) U.S. Cl. ..................... 438/197; 438/301; 438/299
(58) Field of Search ................................. 438/199, 197

(56) References Cited

U.S. PATENT DOCUMENTS

| | | | | |
|---|---|---|---|---|
| 5,633,177 A | * | 5/1997 | Anjum ......................... | 438/301 |
| 5,648,287 A | * | 7/1997 | Tsai et al. .................... | 438/305 |
| 5,691,212 A | * | 11/1997 | Tsai et al. .................... | 438/297 |
| 5,849,616 A | * | 12/1998 | Ogoh .......................... | 438/231 |
| 6,010,952 A | | 1/2000 | Tsai et al. | |
| 6,077,749 A | * | 6/2000 | Gardner et al. ............. | 438/299 |
| 6,107,176 A | * | 8/2000 | Fazan et al. ................. | 438/592 |
| 6,153,483 A | * | 11/2000 | Yeh et al. .................... | 438/299 |
| 6,177,335 B1 | * | 1/2001 | Park et al. ................... | 438/584 |
| 6,274,448 B1 | * | 8/2001 | Lin et al. ..................... | 438/305 |
| 6,316,362 B1 | * | 11/2001 | Inoue .......................... | 438/682 |
| 6,436,747 B1 | * | 8/2002 | Segawa et al. ............. | 438/197 |

FOREIGN PATENT DOCUMENTS

| | | |
|---|---|---|
| JP | 4-215441 | 8/1992 |
| JP | 10-223562 | 8/1998 |

OTHER PUBLICATIONS

T. Ghani, et al., "100 nm Gate Length High Performance/ Low Power CMOS Transistor Structure", 1999 IEEE, (–4– pages).

C.–P. Chao, et al., "Low Resistance Ti OR Co Salicided Raised Source/Drain Transistors for Sub–0.13 μm CMOS Technologies" 1997 IEEE (–4– pages).

* cited by examiner

*Primary Examiner*—Hoai Ho
*Assistant Examiner*—Thao P. Le
(74) *Attorney, Agent, or Firm*—Oblon, Spivak, McClelland, Maier & Neustadt, P.C.

(57) ABSTRACT

A method of manufacturing a semiconductor device includes forming a gate insulating film on a semiconductor substrate, forming a polysilicon layer on the gate insulating film, implanting ions into the polysilicon layer, patterning the polysilicon layer to form a gate electrode, annealing the gate electrode, and siliciding an upper portion of the gate electrode to form a silicide layer that has a lower portion facing the gate electrode and an upper portion opposite to the lower portion, the upper portion of the silicide layer being wider than the lower portion. A total dose of ions implanted during the step of implanting is $6 \times 10^{15}/cm^2$ or larger.

11 Claims, 11 Drawing Sheets

METHOD OF MANUFACTURING SEMICONDUCTOR DEVICE HAVING GATE ELECTRODE WITH EXPANDED UPPER PORTION

BACKGROUND OF THE INVENTION

1. Field of the Invention

The present invention relates to a structure of a gate electrode, and more particularly to a technique for forming a gate structure in which a silicide layer is stacked on a polysilicon layer.

2. Description of the Background Art

Conventionally, polycrystalline silicon (polysilicon) has been widely used as a material for a portion which should be resistant to heat, such as a gate electrode of a MOS transistor or a wire at a lower level of a multi-level interconnect structure.

In recent years, a semiconductor device has been further miniaturized, as well as an operation speed thereof has been further increased, to require reduction of a resistance and narrowing of a gate electrode (reduction of a gate length) of a MOS transistor. One known technique to meet with the foregoing requirement is siliciding of an upper portion of a gate electrode formed using polysilicon, which provides for reduction of a resistance of the gate electrode. Thus, a gate electrode has typically a structure where a silicide layer is formed on a polysilicon layer.

FIG. 28 is a copy of a photograph of a section of a MOS transistor in a conventional semiconductor device, which is taken along a direction of a channel length of the MOS transistor. FIG. 29 is a diagrammatical illustration of FIG. 28. Below, a structure of the conventional semiconductor device will be described with reference to those figures.

A gate insulating film 3 and a gate electrode 4 are formed on a well 2 which has a polarity of either a p-type or an n-type and is formed in a silicon substrate 1. The gate electrode 4 is formed of polysilicon with an upper portion thereof being silicided. In other words, the gate electrode 4 includes a polysilicon layer 4a and a silicide layer 4b formed on the polysilicon layer 4a. Further, a sidewall 5 is formed on a side face of the gate electrode 4. Moreover, source/drain regions 6 each having a polarity reverse to that of the well 2 are formed in the well 2 on opposite sides of the gate electrode 4. Each of the source/drain regions 6 has a two-part structure composed of a relatively shallow source/drain extension layer 6a and a relatively deep source/drain diffusion layer 6b. A surface portion of each of the source/drain regions 6 is silicided so that a silicide layer 6c is formed in a corresponding portion.

Siliciding of a polysilicon gate electrode of a MOS transistor is typically formed by the following steps. First, a gate electrode and source/drain regions are formed on a silicon substrate, directly on which a metal film is then formed. Next, annealing is carried out to cause a metal in the metal film and silicon in the gate electrode and the source/drain region to react with each other. As a result, a silicide layer is formed in a self-aligned manner in an upper portion of each of the gate electrode and the source/drain regions. The foregoing steps are collectively known as a salicide (self-aligned-silicide) process.

As generally known, when a metal and silicon are caused to react with each other to form silicide as in a salicide process described above, a volume of the silicide formed as a result of the reaction between the metal and the silicon is smaller than a total volume of the metal and the silicide before the reaction. Accordingly, the silicide as formed should suffer a great stress.

Thus, when narrowing of a polysilicon gate electrode (reduction of a gate length) is further advanced to such an extent that the width of the gate electrode is substantially equal to a grain size of silicide, use of siliciding results in agglomeration of silicide to be formed, to possibly cause disconnection. As a result, a wire resistance is significantly increased to invite signal delay. Signal delay is a detrimental to increase in an operation speed of a semiconductor device, and degrades an operational reliability. In fact, as narrowing of a gate electrode is further advanced, it becomes more difficult to rely on siliciding of an upper portion of the gate electrode to achieve reduction of a resistance.

In accordance with conventional practices to overcome the above-described problem, a polysilicon gate electrode is formed such that a size of an upper portion thereof (i.e., a portion in which silicide is formed) is increased. Such structure makes it possible to reduce a gate length of a transistor, while preventing agglomeration of silicide in the gate electrode to reduce a resistance. Known examples of the gate electrode having the foregoing structure include a notched gate electrode, a T-shaped gate electrode and an inverted-trapezoid-shaped gate electrode.

A notched gate electrode is as described by T. Ghani et al. in an article entitled "100 nm Gate Length High Performance/Low Power CMOS Transistor Structure" IEDM Technology Digest, IEEE, 1999, pp. 143, for example. A T-shaped gate electrode is as described by C.-P. Chao et al. in an article entitled "Low Resistance Ti or Co Salicided Raised Source/Drain Transistors for Sub-0.13 $\mu$m CMOS Technologies" IEDM Technology Digest, IEEE, 1997, pp. 103, for example. An inverted-trapezoid-shaped gate electrode is as described in Japanese Patent Application Laid-Open No. 4-215441 on pages 3 through 5 and FIGS. 1 through 5B, for example.

However, the above-cited known structures for gate electrodes have disadvantages. With respect to a notched gate electrode, which is intended to reduce a gate length by forming a notch in a bottom corner of a gate electrode, it is technically difficult to steadily form a gate electrode with a notch at a bottom corner thereof, and thus is not suitable for mass production.

A T-shaped gate electrode is intended to reduce a resistance of a gate electrode by forming a polysilicon layer wider than a gate electrode on the gate electrode. To form a T-shaped gate electrode requires use of a process for forming a raised source/drain structure which involves selective epitaxial growth. It is also technically difficult to carry out such a process which involves selective epitaxial growth, in view of non-establishment of a standardized method of measuring a thickness of a grown film, incompleteness of selectivity or the like.

Then, an inverted-trapezoid-shaped gate electrode is intended to reduce a resistance of a gate electrode by forming a gate electrode such that a vertical section thereof taken along a direction of a channel length has a shape of an inverted trapezoid. To form a gate electrode so as to have a shape of an inverted trapezoid in vertical section requires a damascene process or the like, to necessitate substantial modification to a conventional manufacturing process.

SUMMARY OF THE INVENTION

It is an object of the present invention to provide a semiconductor device which can be formed easily and provides for reduction of a gate length and a resistance of a gate electrode in a MOS transistor, and to provide a manufacturing method thereof.

According to a first aspect of the present invention, a semiconductor device includes the steps (a) to (e). The step (a) is to form a gate insulating film on a semiconductor substrate and forming polysilicon on the gate insulating film. The step (b) is to implant ions into the polysilicon. The step (c) is patterning of the polysilicon to form a gate electrode. The step (d) is to anneal the gate electrode. The step (e) is siliciding of an upper portion of the gate electrode. A total dose of the ions to be implanted in the step (b) is $6 \times 10^{15}/cm^2$ or larger.

The annealing process in the step (d) causes an upper portion of the gate electrode to expand. For this reason, even when the width of the gate electrode is reduced for the purpose of reducing a gate length, agglomeration of silicide formed in the upper portion of the gate electrode in the step (e) can be prevented. Thus, it is possible to reduce both the gate length and a resistance of the gate electrode of a MOS transistor. This contributes to increase in an operation speed and improvement in operational reliability of the semiconductor device. Further, the semiconductor device can be formed without having to use a technically difficult process.

A second aspect of the present invention is intended for a method of manufacturing a semiconductor device including a p-channel MOS transistor and an n-channel MOS transistor. According to the third aspect of the present invention, the method includes the steps (a) to (g). The step (a) is to form a gate insulating film on a semiconductor substrate, and form polysilicon on the gate insulating film. The step (b) is to implant phosphorus ions into an entire surface of the polysilicon except a region where the p-channel MOS transistor is to be formed. The step (c) is patterning of the polysilicon to form respective gate electrodes of the p-channel MOS transistor and the n-channel MOS transistor. The step (c) is performed after the step (b). The step (d) is to form a source/drain region of the n-channel MOS transistor in the semiconductor substrate by ion implantation using the gate electrode of the n-channel MOS transistor as a mask. The step (e) is to form a source/drain region of the p-channel MOS transistor in the semiconductor substrate by another ion implantation using the gate electrode of the p-channel MOS transistor as a mask. The step (f) is to anneal the respective gate electrodes of the p-channel MOS transistor and the n-channel MOS transistor. The step (g) is siliciding of an upper portion of each of the respective gate electrodes of the p-channel MOS transistor and the n-channel MOS transistor. A total dose of ions implanted in the steps (b) and (d) is $6 \times 10^{15}/cm^2$ or larger.

The annealing process in the step (f) causes an upper portion of the gate electrode to expand. For this reason, even when the width of the gate electrode is reduced for the purpose of reducing a gate length, agglomeration of silicide formed in the upper portion of the gate electrode in the step (g) can be prevented. Further, as the phosphorus ions are typical n-type dopants and each have a relatively large mass number, the use of the phosphorus ions contributes to facilitation of the method of manufacturing a semiconductor device according to the present invention, and allows the upper portion of the gate electrode to efficiently expand. Moreover, by implanting the phosphorus ions at a high concentration into the polysilicon of the gate electrode of the n-channel MOS transistor, it is possible to suppress depletion of the gate electrode, which results in improvement in a current drive capability.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
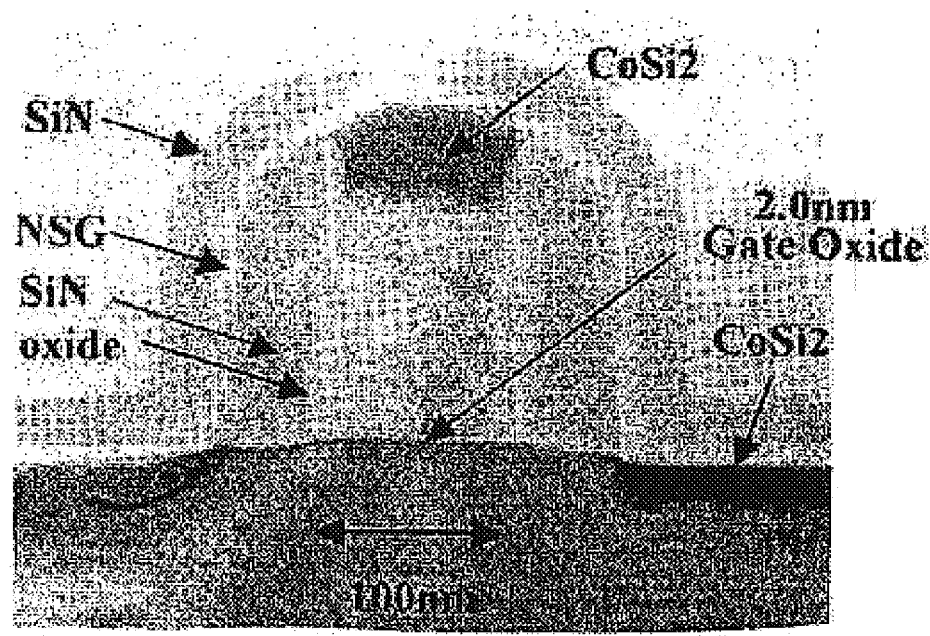
FIG. 1 is a copy of a photograph of a section of a MOS transistor in a semiconductor device according to a first preferred embodiment of the present invention, which is taken along a direction of a channel length of the MOS transistor.
Figure 2:
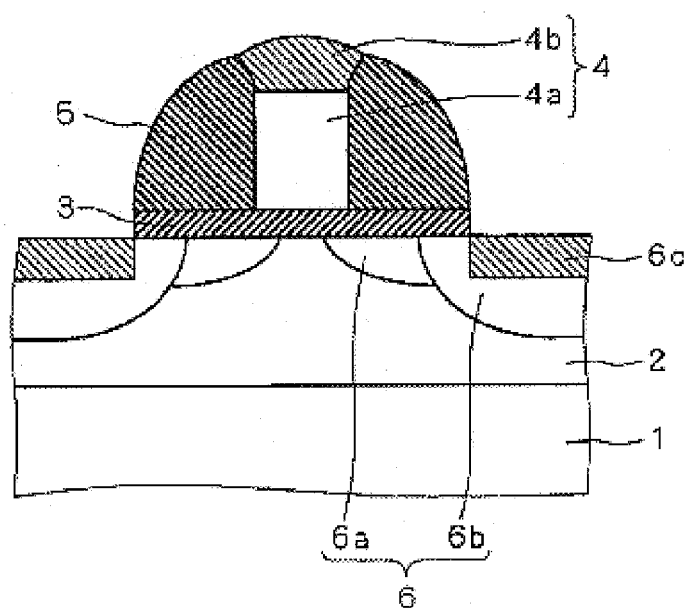
FIG. 2 is a diagrammatical view illustrating the section of the MOS transistor in the semiconductor device according to the first preferred embodiment of the present invention, which is taken along the direction of the channel length of the MOS transistor.
Figure 29:
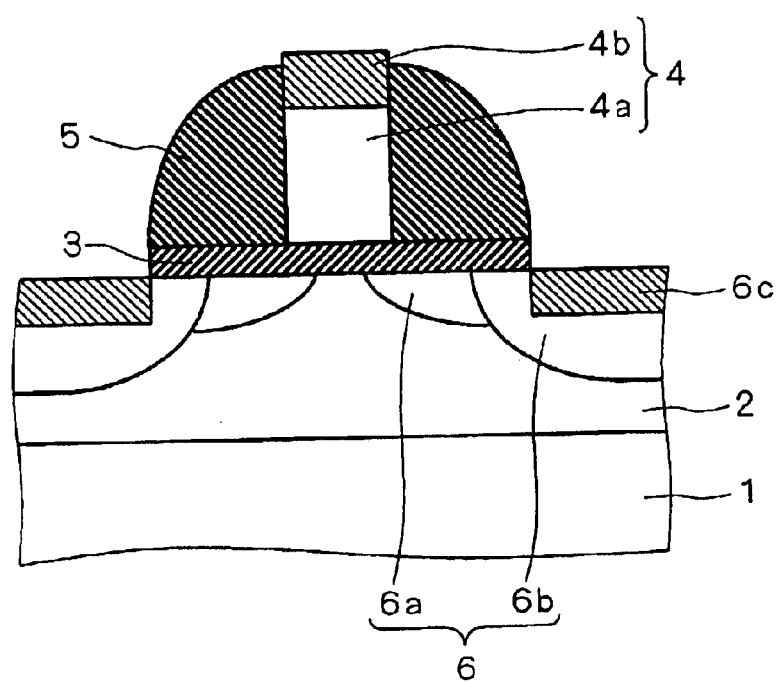
FIG. 29 is a diagrammatical view of the section of the MOS transistor in the conventional semiconductor device, which is taken along the direction of the channel length of the MOS transistor.

FIG. 1 is a copy of a photograph of a section of a MOS transistor in a semiconductor device according to a first preferred embodiment of the present invention, which is taken along a direction of a channel length (channel length direction) of the MOS transistor. FIG. 2 is a diagrammatic illustration of FIG. 1. It is noted that each element of FIG. 2 having the same function as any of the elements in FIG. 29 is indicated by the same reference numeral, and a detailed description thereof will be omitted hereinafter.

As illustrated in FIG. 2, a silicide layer 4b formed in an upper portion of a gate electrode 4 has a shape with an upper portion thereof being wider than a bottom portion thereof in section taken along a channel length direction. On the other hand, a polysilicon layer 4a in a lower portion of the gate electrode 4 has a shape similar to that in the conventional semiconductor device, i.e., a shape with an upper portion and a bottom portion thereof having the substantially same width in section taken along a channel length direction.

As a result of the foregoing configuration, it is possible to keep the width of the silicide layer 4b larger than a gate length of the MOS transistor even if the width of the polysilicon layer 4a is decreased for the purpose of reducing the gate length. Accordingly, agglomeration of silicide can be prevented. Thus, the foregoing configuration makes it possible to reduce the gate length of the MOS transistor, as well as to reduce a resistance of the gate electrode of the MOS transistor. Hence, the semiconductor device according to the first preferred embodiment provides for increase in an operation speed and improvement in operational reliability.

FIGS. 3 through 10 are views for illustrating a method of manufacturing a semiconductor device according to the first preferred embodiment. Below, the method of manufacturing a semiconductor device according to the first preferred embodiment will be described in detail with reference to those figures.

Prior to discussing the manufacturing method, it is noted that the inventors of the present invention have discovered that when a large dose of ions are implanted into polysilicon and annealing is performed on the resultant polysilicon, re-crystallization of silicon occurs in the polysilicon due to the annealing, during which the polysilicon expands (i.e., a volume thereof is increased). Further, the inventors of the present invention have observed the following features of the expansion of polysilicon. One feature is that a surface portion of polysilicon into which ions are implanted tends to expand to a greater extent as compared to the other portions. Another feature is that the expansion of polysilicon is pronounced when a total dose of ions implanted into the polysilicon is $6 \times 10^{15}$ or larger.

Figure 3:
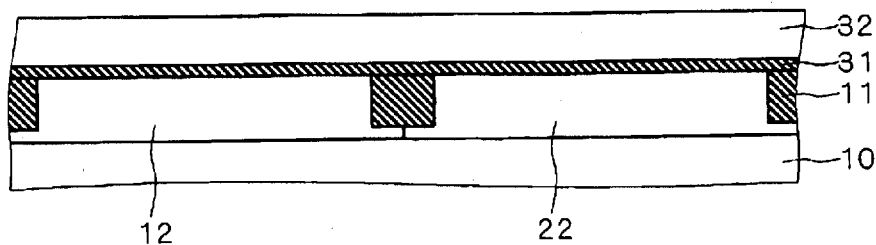
FIGS. 3 through 10 are views for illustrating a method of manufacturing a semiconductor device according to the first preferred embodiment of the present invention.

Turning to the manufacturing method, first, an isolation film 11, a p-well 12 and an n-well 22 are formed on a silicon substrate 10. Thereafter, a silicon oxide film 31 as a material for forming a gate insulating film is formed so as to have a thickness of approximately 0.5–10 nm, for example, on the resultant structure. Subsequently, a polysilicon film 32 as a material for forming a gate electrode is formed so as to have a thickness of approximately 50–300 nm, for example, on the silicon oxide film 31 (FIG. 3).

Figure 4:
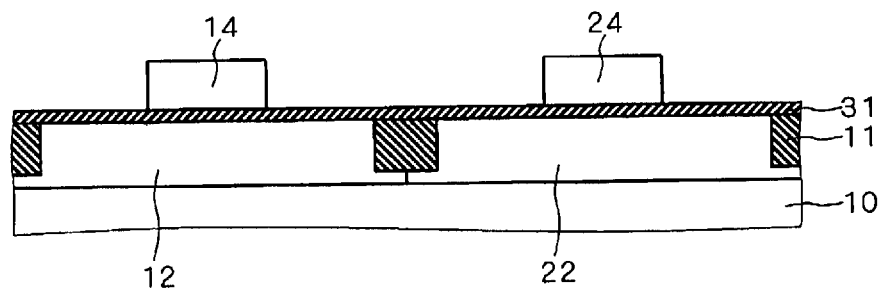

Next, the polysilicon film 32 is patterned by a photolithography process, to form gate electrodes 14 and 24 on the p-well 12 and the n-well 22, respectively (FIG. 4).

Figure 5:
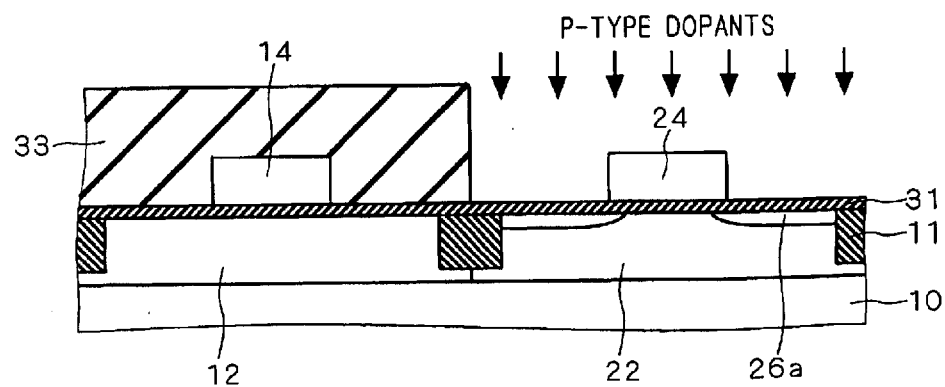

A resist mask 33 having an opening located in a region where a pMOS transistor is to be formed is formed by a photolithography process. Then, implantation of B ions or $BF_2$ ions as p-type dopants is carried out using the resist mask 33 and the gate electrode 24 as a mask. This implantation is carried out under process conditions that an energy is in a range from 0.2 keV to 12 keV, and a dose is in a range from $1 \times 10^{14}/cm^2$ to $1 \times 10^{15}/cm^2$. As a result, a p-type source/drain extension layer 26a is formed at a relatively shallow portion in the n-well 22 (FIG. 5). During the implantation at that time, ions at a dose in a range from $1 \times 10^{14}/cm^2$ to $1 \times 10^{15}/cm^2$ are also implanted into a top face of the gate electrode 24 which is functioning as a mask for the implantation.

Figure 6:
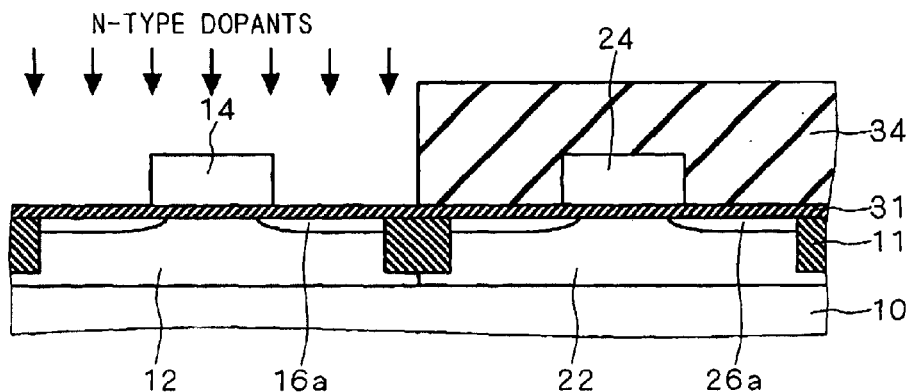

A resist mask 34 having an opening located in a region where an nMOS transistor is to be formed is formed by a photolithography process. Then, implantation of As ions as n-type dopants is carried out using the resist mask 34 and the gate electrode 14 as a mask. This implantation is carried out under process conditions that an energy is in a range from 0.5 keV to 15 keV, and a dose is in a range from $1 \times 10^{14}/cm^2$ to $2 \times 10^{15}/cm^2$. As a result, an n-type source/drain extension layer 16a is formed at a relatively shallow portion in the p-well 12 (FIG. 6). During the implantation at that time, ions at a dose in a range from $1 \times 10^{14}/cm^2$ to $2 \times 10^{15}/cm^2$ are also implanted into a top face of the gate electrode 14 which is functioning as a mask for the implantation.

Figure 7:
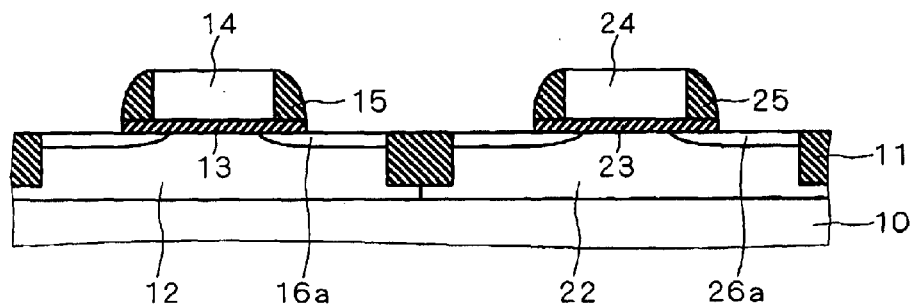

Further, sidewalls 15 and 25 are formed on respective side faces of the gate electrodes 14 and 24, respectively. Moreover, the silicon oxide film 31 is etched to form gate insulating films 13 and 23 under the gate electrodes 14 and 24, respectively (FIG. 7).

Figure 8:
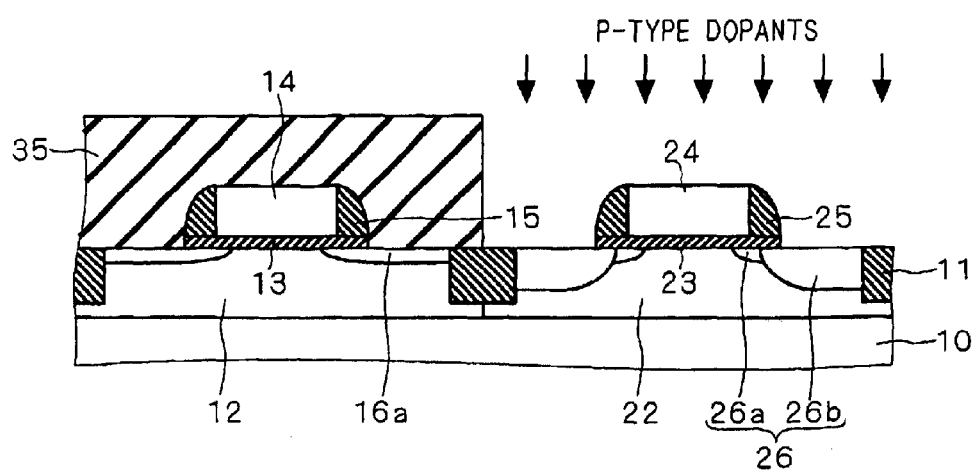

Then, a resist mask 35 having an opening located in the region where the pMOS transistor is to be formed is again formed. Then, implantation of B ions or $BF_2$ ions as p-type dopants is carried out using the resist mask 35, the gate electrode 24 and the sidewall 25 as a mask. For this implantation, the following process conditions are employed. Specifically, when B ions are used, an energy is in a range from 2 keV to 5 keV, and a dose is $6 \times 10^{15}/cm^2$ or larger, while when $BF_2$ ions are used, an energy is in a range from 15 keV to 30 keV, and a dose is $6 \times 10^{15}/cm^2$ or larger. As a result, a p-type source/drain diffusion layer 26b is formed at a relatively deep portion in the n-well 22 (FIG. 8). During the implantation at that time, ions at a dose of $6 \times 10^{15}/cm^2$ or larger are also implanted into the top face of the gate electrode 24 which is functioning as a mask for the implantation. By the above-described processes of ion implantation for forming the p-type source/drain extension layer 26a and the p-type source/drain diffusion layer 26b, a p-type source/drain region 26 composed of layers 26a and 26b is formed.

Figure 9:
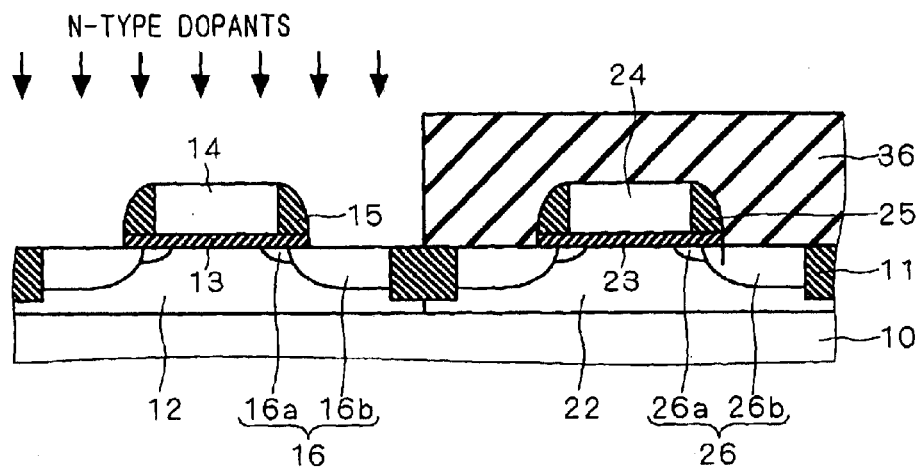

Next, a resist mask 36 having an opening located in the region where the NMOS transistor is to be formed is formed. Then, implantation of P (phosphorus) ions as n-type dopants is carried out using the resist mask 36, the gate electrode 14 and the sidewall 15 as a mask. This implantation is carried out under process conditions that an energy is in a range from 2 keV to 10 keV, and a dose is $6 \times 10^{15}/cm^2$ or larger. As a result, an n-type source/drain diffusion layer 16b is formed at a relatively deep portion in the p-well 12 (FIG. 9). During the implantation at that time, ions at a dose of $6 \times 10^{15}/cm^2$ or larger are also implanted into the top face of the gate electrode 14 which is functioning as a mask for the implantation. By the above-described processes of ion implantation for forming the n-type source/drain extension layer 16a and the n-type source/drain diffusion layer 16b, an n-type source/drain region 16 composed of layers 16a and 16b is formed.

Thereafter, annealing is carried out at a temperature of approximately 1000° C., to repair damage caused by the processes of ion implantation and to activate the dopants. During the formation of the source/drain regions 16 and 26, ions at a dose of $6 \times 10^{15}/cm^2$ or larger are implanted into each of the gate electrodes 14 and 24 of polysilicon. Accordingly, a surface (top face) portion of each of the gate electrodes 14 and 24 into which ions are implanted expands in response to the annealing.

Figure 10:
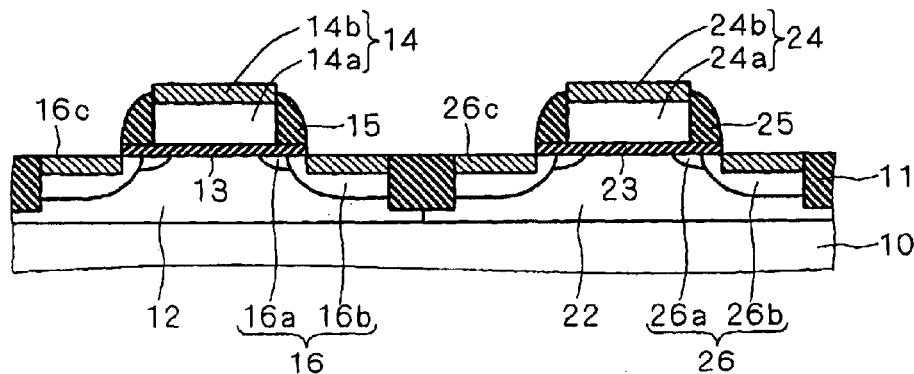

A metal film made of Co or the like is formed on an entire surface of the resultant structure by a sputtering process, and annealing is carried out at a relatively low temperature in a range from approximately 350 to 550° C., to cause a portion of the metal film formed on silicon (i.e., the gate electrodes 14 and 24, and the source/drain regions 16 and 26) to react with the silicon. Then, another portion of the metal film which fails to react with the silicon and remains on an insulating film (i.e., the isolation film 11 and the sidewalls 15 and 25) is selectively removed. Subsequently, high-temperature annealing is carried out, to form a silicide layer in an upper portion of each of the gate electrodes 14 and 24 and the source/drain regions 16 and 26. Thus, the gate electrode 14 has a bilayer structure of a polysilicon layer 14a and a silicide layer 14b, while the gate electrode 24 has a bilayer structure of a polysilicon layer 24a and a silicide layer 24b. Further, silicide layers 16c and 26c are formed in respective upper portions of the n-type source/drain region 16 and the p-type source/drain region 26, respectively (FIG. 10).

During formation of the silicide layers 14b and 24b, agglomeration of silicide (the silicide layers 14b and 24b) is prevented because the respective surface portions of the gate electrodes 14 and 24 in which the silicide layers 14b and 24b are formed have expanded. On the other hand, the respective bottom portions (i.e., the polysilicon layers 14a and 24a) of the gate electrodes 14 and 24 do not expand, and thus do not inhibit reduction of the gate length of the MOS transistor.

In the foregoing manner, the silicide layers 14b and 24b are formed in the respective surface portions of the gate electrode 14 and 24, respectively, which portions have expanded. Accordingly, each of the gate electrodes 14 and 24 has the same structure as the gate electrode 4 illustrated in FIGS. 1 and 2. More specifically, each of the polysilicon layers 14a and 24a has a shape with upper and bottom portions thereof having the substantially same width in section taken along a channel length direction, and each of the silicide layers 14b and 24b has a shape with an upper portion thereof being wider than a bottom portion thereof in section taken along a channel length direction. Hence, it is possible to reduce the gate length of the MOS transistor, as well as to reduce a resistance of the gate electrode of the MOS transistor. This contributes to increase in an operation speed and improvement in operational reliability of the semiconductor device. Further, the above-described semiconductor device according to the first preferred embodiment can be easily formed without having to use a technically difficult process which is required for forming a notched gate electrode or a T-shaped gate electrode as described in the Background Art portion of the instant specification.

Second Preferred Embodiment

Prior to discussing a second preferred embodiment of the present invention, it is noted that the inventors of the present invention have observed a further feature of the expansion of polysilicon which is caused by the above-described treatments, i.e., by ion implantation at a large dose and annealing. The further feature observed by the inventors of the present invention is that increase in mass number of each ion to be implanted results in increase in an atomic radius of each ion, to promote the expansion.

In view of the foregoing feature, according to the second preferred embodiment, ion implantation into polysilicon to form a gate electrode is performed using ions each having a relatively large mass number. More specifically, according to the second preferred embodiment, ions each having a relatively large mass number are used in the processes of ion implantation for forming the source/drain regions 16 and 26 in the manufacturing method described in the first preferred embodiment. In other words, dopants each having a relatively large mass number are implanted in the processes of ion implantation for forming the p-type source/drain diffusion layer 26b (FIG. 5), the p-type source/drain extension layer 26a (FIG. 6), the n-type source/drain diffusion layer 16b (FIG. 8) and the n-type source/drain extension layer 16a (FIG. 9).

For example, $BF_3$ ions or In ions as p-type dopants each having a relatively large mass number are implanted using the gate electrode 24 and the sidewall 25 as a mask in the process of ion implantation for forming the n-type source/drain diffusion layer 16b. For this ion implantation, the following process conditions are employed. When $BF_3$ ions are used, an energy is in a range from 25 keV to 60 keV, while when In ions are used, an energy is in a range from 30 keV to 100 keV. In either case, a dose is $6 \times 10^{15}/cm^2$ or larger.

Also, As ions or Sb ions as n-type dopants each having a relatively large mass number are implanted using the gate electrode 14 and the sidewall 15 as a mask in the process of ion implantation for forming the n-type source/drain extension layer 16a. For this ion implantation, the following process conditions are employed. When As ions are used, an energy is in a range from 20 keV to 60 keV, while when Sb ions are used, an energy is in a range from 30 keV to 100 keV. In either case, and a dose is $6 \times 10^{15}/cm^2$ or larger.

During the foregoing processes of ion implantation, the ions each having a relatively large mass number are also implanted at a dose of $6 \times 10^{15}/cm^2$ or larger into each of the gate electrodes 14 and 24 each of which is functioning as a mask for the implantation. Hence, the upper portion of each of the gate electrodes 14 and 24 expands to a greater extent in response to the subsequent process of annealing, as compared to the first preferred embodiment.

As a result, agglomeration of the silicide formed in the respective upper portions of the gate electrodes 14 and 24 is more effectively prevented. Further, the respective bottom portions (i.e., the polysilicon layers 14a and 24a) of the gate electrodes 14 and 24 do not expand, and thus do not inhibit reduction of the gate length of the MOS transistor. Accordingly, the second preferred embodiment makes it possible to reduce the gate length of the MOS transistor, as well as to reduce a resistance of the gate electrode of the MOS transistor. This contributes to increase in an operation speed and improvement in operational reliability of the semiconductor device.

Furthermore, increase in a mass number of each ion to be implanted into the polysilicon for forming the gate electrode promotes expansion of an upper portion of the gate electrode as described above. As such, by increasing a mass number of each ion to be implanted into the polysilicon, it is possible to more effectively prevent agglomeration of silicide. More specifically, agglomeration of silicide is more effectively prevented when ions each having a mass number of 70 or larger, are used, which has been confirmed by the inventors of the present invention.

Third Preferred Embodiment

In the first and second preferred embodiments, the processes of ion implantation for forming the source/drain regions 16 and 26 (i.e., the source/drain extension layers 16a and 26a and the source/drain diffusion layers 16b and 26b) are utilized for implanting ions at a dose of $6\times10^{15}/cm^2$ or larger into the polysilicon forming the gate electrode. However, ion implantation at a dose of $6\times10^{15}/cm^2$ or larger into the polysilicon forming the gate electrode may alternatively be accomplished by a distinct process of ion implantation from the processes of ion implantation for forming the source/drain regions 16 and 26.

Below, a method of manufacturing a semiconductor device according to a third preferred embodiment of the present invention will be described. First, the isolation film 11, the p-well 12, the n-well 22, the gate insulating films 13 and 23, the gate electrodes 14 and 24, the p-type source/drain extension layer 26a, the n-type source/drain extension layer 16a and the sidewalls 15 and 25 are formed on the silicon substrate 10 in the same manner as in the first preferred embodiment (FIGS. 3 through 7).

Figure 11:
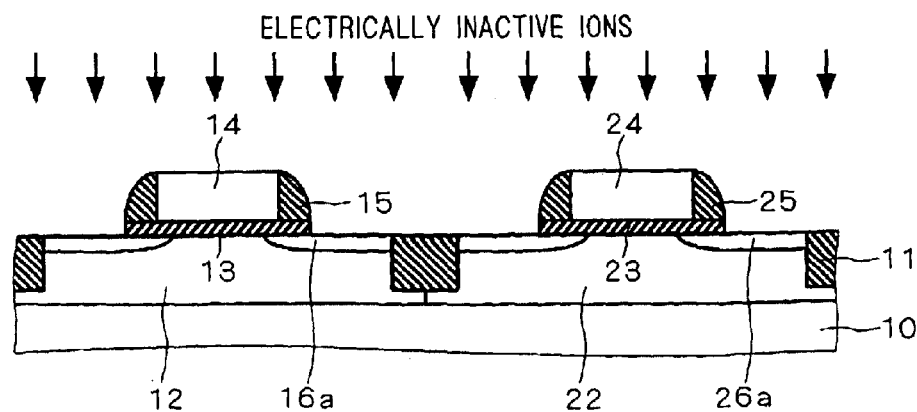
FIG. 11 is a view for illustrating a method of manufacturing a semiconductor device according to a third preferred embodiment of the present invention.

Thereafter, electrically inactive ions such as Si ions, Ge ions, Ar ions, Kr ions and Xe ions are implanted at a dose of $1\times10^{15}/cm^2$ or larger into an entire surface of the resultant structure, as illustrated in FIG. 11. As a result, ions at a dose of $1\times10^{15}/cm^2$ or larger are implanted into each of the gate electrodes 14 and 24. While the ion implantation at that time permits ions to be implanted into the source/drain regions of the MOS transistor as appreciated from illustration of FIG. 11, the ions implanted into the source/drain regions do not function as dopants because they are electrically inactive. Hence, the ions implanted into the source/drain regions do not contribute to occurrence of a short channel effect of the MOS transistor.

Then, B ions as p-type dopants are implanted into a region where a pMOS transistor is to be formed is formed in the same manner as in the first preferred embodiment. This ion implantation is carried out under process conditions that an energy is in a range from 2 keV to 5 keV and a dose is $1\times10^{15}/cm^2$ or larger. As a result, the p-type source/drain diffusion layer 26b is formed at a relatively deep portion in the n-well 22 (FIG. 8). The dose for the ion implantation at that time is determined so as to allow a sum of the dose for the ion implantation at that time, the dose for the ion implantation for forming the p-type source/drain extension layer 26a and the dose for the ion implantation of the electrically inactive ions, to be $6\times10^{15}/cm^2$ or larger. In other words, the dose for the ion implantation at that time is determined so as to allow a total dose of ions implanted into the gate electrode 24 to be $6\times10^{15}/cm^2$ or larger.

Next, As ions as n-type dopants are implanted into a region where an nMOS transistor is to be formed is formed. This ion implantation is carried out under process conditions that an energy is in a range from 20 keV to 60 keV and a dose is $1\times10^{15}/cm^2$ or larger. As a result, the n-type source/drain diffusion layer 16b is formed at a relatively deep portion in the p-well 12 (FIG. 9). The dose for the ion implantation at that time is determined so as to allow a sum of the dose for the ion implantation at that time, the dose for the ion implantation for forming the n-type source/drain extension layer 16a and the dose for the ion implantation of the electrically inactive ions, to be $6\times10^{15}/cm^2$ or larger. In other words, the dose for the ion implantation at that time is determined so as to allow a total dose of ions implanted into the gate electrode 14 to be $6\times10^{15}/cm^2$ or larger.

Thereafter, annealing is carried out at a temperature of approximately 1000° C., to repair damage caused by the processes of ion implantation and to activate the dopants. Since each of the gate electrodes 14 and 24 has ions at a dose of $6\times10^{15}/cm^2$ or larger implanted thereinto, a surface (top face) portion of each of the gate electrodes 14 and 24 into which ions are implanted expands in response to the annealing.

Subsequently, a silicide layer is formed in an upper portion of each of the gate electrodes 14 and 24 and the source/drain regions 16 and 26. Accordingly, the gate electrode 14 has a bilayer structure of the polysilicon layer 14a and the silicide layer 14b, while the gate electrode 24 has a bilayer structure of the polysilicon layer 24a and the silicide layer 24b. Further, the silicide layers 16c and 26c are formed in respective upper portions of the n-type source/drain region 16 and the p-type source/drain region 26, respectively (FIG. 10).

During formation of the silicide layers 14b and 24b, agglomeration of silicide (the silicide layers 14b and 24b) is prevented because the respective surface portions of the gate electrodes 14 and 24 in which the silicide layers 14b and 24b are formed have expanded. On the other hand, the respective bottom portions (i.e., the polysilicon layers 14a and 24a) of the gate electrodes 14 and 24 do not expand, and thus do not inhibit reduction of the gate length of the MOS transistor.

Thus, also according to the third preferred embodiment, each of the gate electrodes 14 and 24 has the same structure as the gate electrode 4 illustrated in FIGS. 1 and 2. Hence, it is possible to reduce the gate length of the MOS transistor, as well as to reduce a resistance of the gate electrode of the MOS transistor. This contributes to increase in an operation speed and improvement in operational reliability of the semiconductor device. Further, by increasing a mass number of each of the electrically inactive ions to be implanted into the polysilicon forming the gate electrode (to be approximately 70 or greater), it is possible to more effectively prevent agglomeration of silicide, of course.

Fourth Preferred Embodiment

In the third preferred embodiment, the implantation of electrically inactive ions is performed after the gate insulating films 13 and 23, the gate electrodes 14 and 24 and sidewalls 15 and 25 are formed (that is, after the polysilicon film 32 is patterned). As such, also the source/drain regions of the MOS transistor have electrically inactive ions implanted thereto. However, as described in the third preferred embodiment, the electrically inactive ions implanted into the source/drain regions can not function as dopants, so that the electrically inactive ions implanted into the source/drain regions do not contribute to occurrence of a short channel effect.

Nonetheless, the implantation of electrically inactive ions into the source/drain regions may increase a possibility of occurrence of a crystal defect in the source/drain regions, which is likely to invite increase in leakage current. A fourth preferred embodiment allows for such situation, and will describe how to prevent electrically inactive ions implanted into a gate electrode from being unwantedly implanted into a source/drain region.

Below, a method of manufacturing a semiconductor device according to the fourth preferred embodiment will be described. First, the isolation film 11, the p-well 12 and the n-well 22 are formed on the silicon substrate 10 in the same manner as in the first preferred embodiment. Subsequently, the silicon oxide film 31 and the polysilicon film 32 are formed on the resultant structure (FIG. 3).

Figure 12:
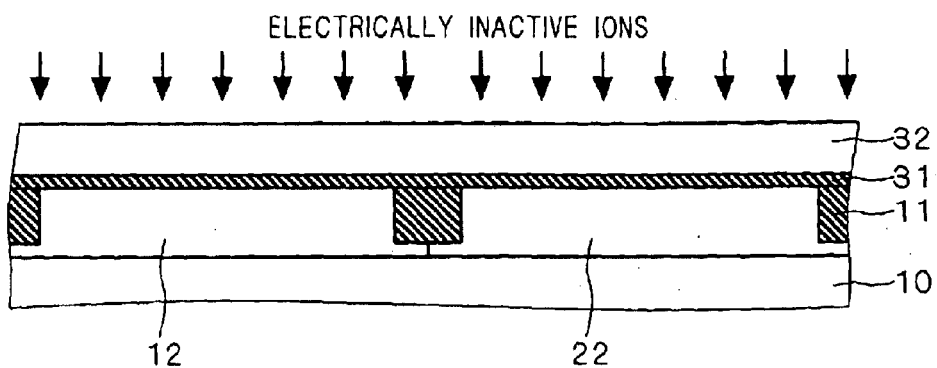
FIG. 12 is a view for illustrating a method of manufacturing a semiconductor device according to a fourth preferred embodiment of the present invention.

Immediately after formation of the polysilicon film 32 (in other words, before the polysilicon film 32 is patterned), electrically inactive ions such as Si ions, Ge ions, Ar ions, Kr ions and Xe ions are implanted at a dose of $1\times10^{15}/cm^2$ or larger into an entire surface of the polysilicon film 32 before the polysilicon film 32 is patterned, as illustrated in FIG. 12. This process of implantation of electrically inactive ions is carried out with the source/drain regions of the MOS transistor being entirely covered with the silicon oxide film 31 and the polysilicon film 32, so that no ion is implanted into the source/drain regions. Accordingly, it is possible to prevent occurrence of a crystal defect in the source/drain regions.

Thereafter, the polysilicon film 32 is patterned to form the gate electrodes 14 and 24 on the p-well 12 and the n-well 22, respectively, by the same processes as in the first preferred embodiment (FIG. 4). Then, the n-type source/drain extension layer 16a, the p-type source/drain extension layer 26a, the sidewalls 15 and 25, the gate insulating films 13 and 23, the n-type source/drain diffusion layer 16b and the p-type source/drain diffusion layer 26b are formed (FIGS. 5 through 9).

Each dose for the processes of ion implantation for forming the n-type source/drain extension layer 16a, the n-type source/drain diffusion layer 16b, the p-type source/drain extension layer 26a and the p-type source/drain diffusion layer 26b is determined so as to allow a total dose of ions implanted into each of the gate electrodes 14 and 24, inclusive of the electrically inactive ions, to be $6\times10^{15}/cm^2$ or larger.

Thereafter, annealing is carried out at a temperature of approximately 1000° C., to repair damage caused by the processes of ion implantation and to activate the dopants. Since each of the gate electrodes 14 and 24 has ions at a dose of $6\times10^{15}/cm^2$ or larger implanted thereinto, a surface (top face) portion of each of the gate electrodes 14 and 24 into which ions are implanted expands in response to the annealing.

Subsequently, the upper portion of each of the gate electrodes 14 and 24 and the source/drain regions 16 and 26 is silicided to form the silicide layers 14b, 24b, 16c and 26c (FIG. 10).

During formation of the silicide layers 14b and 24b, agglomeration of silicide (the silicide layers 14b and 24b) is prevented because the respective surface portions of the gate electrodes 14 and 24 in which the silicide layers 14b and 24b are formed have expanded. On the other hand, the respective bottom portions (i.e., the polysilicon layers 14a and 24a) of the gate electrodes 14 and 24 do not expand, and thus do not inhibit reduction of the gate length of the MOS transistor.

Thus, also according to the fourth preferred embodiment, each of the gate electrodes 14 and 24 has the same structure as the gate electrode 4 illustrated in FIGS. 1 and 2. Hence, it is possible to reduce the gate length of the MOS transistor, as well as to reduce a resistance of the gate electrode of the MOS transistor. This contributes to increase in an operation speed and improvement in operational reliability of the semiconductor device.

Fifth Preferred Embodiment

According to a fifth preferred embodiment, ions each based on a metal (hereinafter, referred to as "metal ions") are implanted, in place of the electrically inactive ions such as Si ions, Ge ions, Ar ions, Kr ions and Xe ions which are cited in the third preferred embodiment.

First, the isolation film 11, the p-well 12, the n-well 22, the gate insulating films 13 and 23, the gate electrodes 14 and 24, the p-type source/drain extension layer 26a, the n-type source/drain extension layer 16a and the sidewalls 15 and 25 are formed on the silicon substrate 10 in the same manner as in the first preferred embodiment (FIGS. 3 through 7).

Figure 13:
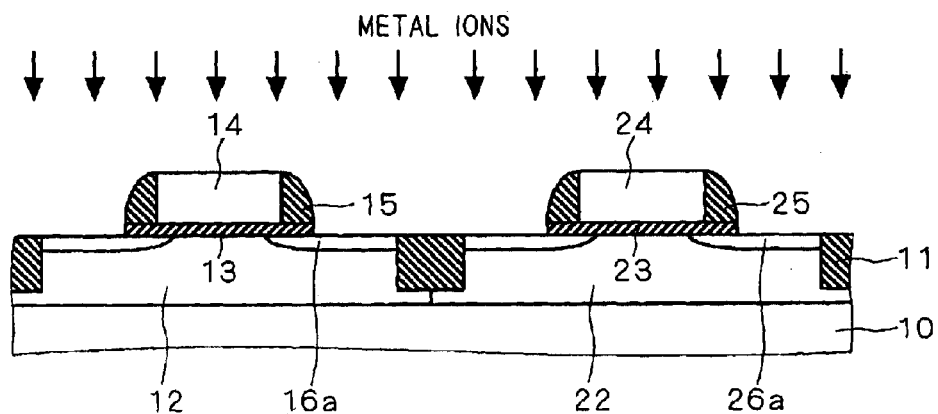
FIG. 13 is a view for illustrating a method of manufacturing a semiconductor device according to a fifth preferred embodiment of the present invention.

Thereafter, ion implantation using a metal as an ion species is carried out. Specifically, metal ions such as Ti ions, Co ions, Ni ions, Mo ions, Ru ions, W ions and Pt ions are implanted at a does of $3\times10^{15}/cm^2$ or a larger into an entire surface of the resultant structure, as illustrated in FIG. 13.

Processes performed thereafter are identical to those described in the first preferred embodiment with reference to FIGS. 8 through 10, and thus are omitted in the fifth preferred embodiment. However, in the fifth preferred embodiment, each dose for the processes of ion implantation for forming the n-type source/drain extension layer 16a, the n-type source/drain diffusion layer 16b, the p-type source/drain extension layer 26a and the p-type source/drain diffusion layer 26b is determined so as to allow a total dose of ions implanted into each of the gate electrodes 14 and 24, inclusive of the metal ions, to be $6\times10^{15}/cm^2$ or larger.

Thus, also according to the fifth preferred embodiment, each of the gate electrodes 14 and 24 has the same structure as the gate electrode 4 illustrated in FIGS. 1 and 2. Hence, it is possible to reduce the gate length of the MOS transistor, as well as to reduce a resistance of the gate electrode of the MOS transistor. This contributes to increase in an operation speed and improvement in operational reliability of the semiconductor device.

Further, since metal ions each have a relatively large mass number, the expansion in the upper portion of the gate electrode is promoted. This enhances the effect of preventing agglomeration of silicide. Moreover, metal atoms of the metal ions, combined with silicon, form a compound, which contributes to reduction of resistances of the source/drain regions and the gate electrode.

Sixth Preferred Embodiment

In the fifth preferred embodiment, the implantation of metal ions is carried out after formation of the gate insulating films 13 and 23 and the gate electrodes 14 and 24 (i.e., after the polysilicon film 32 is patterned). Accordingly, metal ions are also implanted into the source/drain regions of the MOS transistor. This causes metal atoms of the metal ions implanted, combined with silicon, to form a compound, to contribute to reduction of resistances of the source/drain regions and the gate electrode, as described above. However, the implantation of metal ions into the source/drain regions, on the other hand, may increase a possibility of occurrence of a crystal defect in the source/drain regions, which is likely to invite increase in leakage current.

A sixth preferred embodiment allows for such situation, and will describe how to prevent metal ions implanted into a gate electrode from being unwantedly implanted into a source/drain region. The sixth preferred is analogous to the fifth preferred embodiment, but different in that metal ions are implanted in place of the electrically inactive ions implanted into the gate electrodes, such as Si ions, Ge ions, Ar ions, Kr ions and Xe ions.

First, the isolation film 11, the p-well 12 and the n-well 22 are formed on the silicon substrate 10, and the silicon oxide film 31 and the polysilicon film 32 are formed on the resultant structure, in the same manner as in the first preferred embodiment (FIG. 3).

Figure 14:
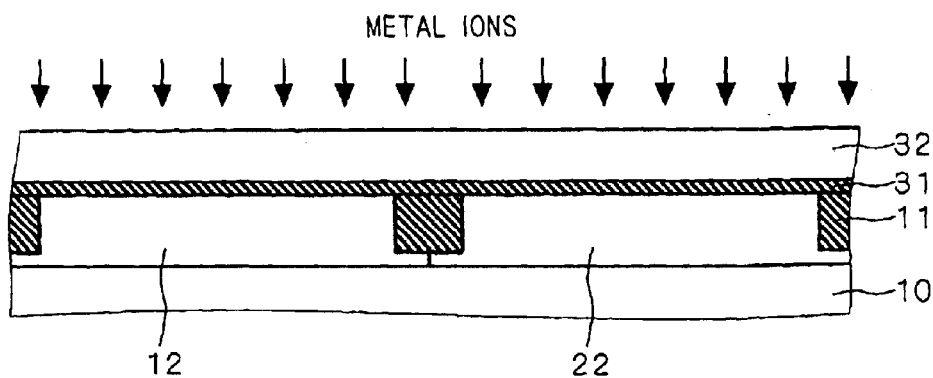
FIG. 14 is a view for illustrating a method of manufacturing a semiconductor device according to a sixth preferred embodiment of the present invention.

Immediately after formation of the polysilicon film 32 (in other words, before the polysilicon film 32 is patterned), ion implantation using a metal as an ion species is carried out. Specifically, metal ions such as Ti ions, Co ions, Ni ions, Mo ions, Ru ions, W ions and Pt ions are implanted at a dose of $3 \times 10^{15}/cm^2$ or larger into an entire surface of the polysilicon film 32 before the polysilicon film 32 is patterned as illustrated in FIG. 14. This process of implantation of metal ions is carried out with the source/drain regions of the MOS transistor being entirely covered with the silicon oxide film 31 and the polysilicon film 32, so that no ion is implanted into the source/drain regions. Accordingly, it is possible to prevent occurrence of a crystal defect in the source/drain regions.

Processes to be performed thereafter are identical to those described in the first preferred embodiment with reference to FIGS. 4 through 10, and thus will be omitted in the sixth preferred embodiment. However, in the sixth preferred embodiment, each dose for the processes of ion implantation for forming the n-type source/drain extension layer 16a, the n-type source/drain diffusion layer 16b, the p-type source/drain extension layer 26a and the p-type source/drain diffusion layer 26b is determined so as to allow a total dose of ions implanted into each of the gate electrodes 14 and 24, inclusive of the metal ions, to be $6 \times 10^{15}/cm^2$ or larger.

Thus, also according to the sixth preferred embodiment, each of the gate electrodes 14 and 24 has the same structure as the gate electrode 4 illustrated in FIGS. 1 and 2. Hence, it is possible to reduce the gate length of the MOS transistor, as well as to reduce a resistance of the gate electrode of the MOS transistor. This contributes to increase in an operation speed and improvement in operational reliability of the semiconductor device.

Further, since metal ions each have a relatively large mass number, the expansion in the upper portion of the gate electrode is promoted. This enhances the effect of preventing agglomeration of silicide. Moreover, the metal atoms of the metal ions, combined with silicon, form a compound, which contributes to reduction of a resistance of the gate electrode.

Seventh Preferred Embodiment

In the fifth preferred embodiment, the implantation of metal ions is carried out after formation of the gate insulating films 13 and 23, the gate electrodes 14 and 24 and the sidewalls 15 and 25. Accordingly, metal ions are implanted also into the sidewalls 15 and 25, which can be also appreciated from FIG. 13. This may cause metal atoms of the metal ions implanted into the sidewalls 15 and 25 to be combined with silicon so that respective surfaces of the sidewalls 15 and 25 may possibly be silicided. The silicided surfaces of the sidewalls 15 and 25 would invite formation of a short circuit between the source/drain regions 16 and 26 and the gate electrodes 14 and 24.

To allow for the foregoing situation, according to the seventh preferred embodiment, the manufacturing method described in the fifth preferred embodiment is modified by including a process of etching the surfaces of the sidewalls 15 and 25 after implanting metal ions into the gate electrodes 14 and 24.

More specifically, first, the isolation film 11, the p-well 12, the n-well 22, the gate insulating films 13 and 23, the gate electrodes 14 and 24, the p-type source/drain extension layer 26a, the n-type source/drain extension layer 16a and the sidewalls 15 and 25 are formed on the silicon substrate 10 in the same manner as in the first preferred embodiment (FIGS. 3 through 7).

Figure 15:
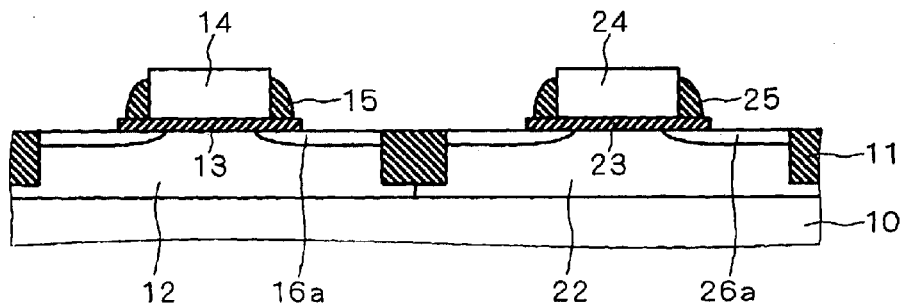
FIGS. 15 and 16 are views for illustrating a method of manufacturing a semiconductor device according to a seventh preferred embodiment of the present invention.

Next, ion implantation using a metal as an ion species is carried out in the same manner as in the fifth preferred embodiment. Specifically, metal ions such as Ti ions, Co ions, Ni ions, Mo ions, Ru ions, W ions and Pt ions are implanted at a dose of $3 \times 10^{15}/cm^2$ or larger into an entire surface of the resultant structure as illustrated in FIG. 13. Subsequently, the respective surfaces of the sidewalls 15 and 25 are etched as illustrated in FIG. 15. For this process of etching, a phosphoric acid treatment is performed when the sidewalls 15 and 25 are formed of silicon nitride, while a hydrofluoric acid treatment is performed when the sidewalls 15 and 25 are formed of silicon oxide.

Processes to be performed thereafter are identical to those described in the first preferred embodiment with reference to FIGS. 8 through 10, and thus will be omitted in the seventh preferred embodiment. However, in the seventh preferred embodiment, each dose for the processes of ion implantation for forming the n-type source/drain extension layer 16a, the n-type source/drain diffusion layer 16b, the p-type source/drain extension layer 26a and the p-type source/drain diffusion layer 26b is determined so as to allow a total dose of ions implanted into each of the gate electrodes 14 and 24, inclusive of a dose of the metal ions, to be $6 \times 10^{15}/cm^2$ or larger.

Figure 16:
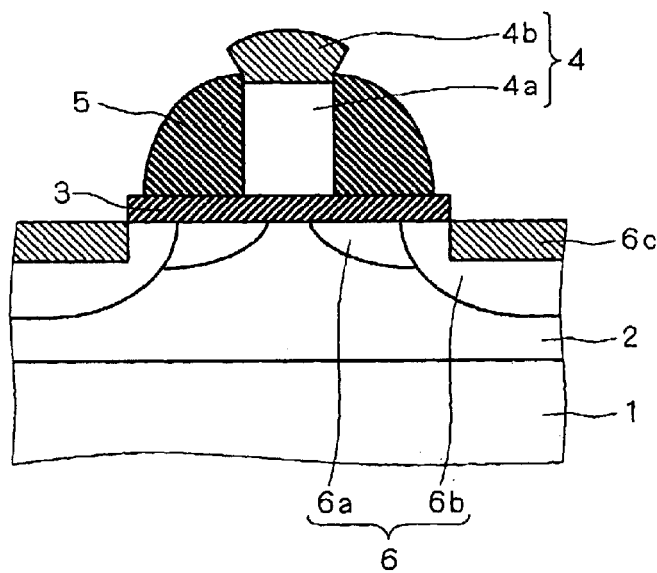

Thus, also according to the seventh preferred embodiment, an upper potion of each of the gate electrodes 14 and 24 is expanded. Therefore, each of the silicide layers 14b and 24b formed in the respective upper portions of the gate electrodes 14 and 24 has a shape with an upper portion thereof being wider than a bottom portion thereof in section taken along a channel length direction. On the other hand, each of the polysilicon layers 14a and 24a has a shape similar to that in the conventional semiconductor device, i.e., a shape with an upper portion and a bottom portion thereof having the substantially same width in section taken along a channel length direction. However, the respective surfaces of the sidewalls formed on the side faces of the gate electrodes are etched according to the seventh preferred embodiment. Accordingly, a shape of the MOS transistor of the seventh preferred embodiment is different from that illustrated in FIG. 2, in that the sidewalls are slightly smaller in section taken along a channel length direction as illustrated in FIG. 16. It is noted that each element in FIG. 16 similar to any of the elements in FIG. 2 is indicated by the same reference numeral.

Thus, even when narrowing of the gate electrode 4 is advanced, agglomeration of silicide in the silicide layer 4b can be prevented. Hence, it is possible to reduce both the gate length and a resistance of the gate electrode of the MOS transistor.

Further, since metal ions each have a relatively large mass number, the expansion in the upper portion of the gate electrode is promoted. This enhances the effect of preventing agglomeration of silicide. Moreover, metal atoms of the metal ions, combined with silicon, form a compound, which contributes to reduction of resistances of the source/drain regions and the gate electrode. In addition, since the surfaces of the sidewalls are etched after implantation of the metal ions, it is possible to prevent a short-circuit from being formed between the source/drain regions and the gate electrodes due to siliciding of the surfaces of the sidewalls.

Eighth Preferred Embodiment

FIGS. 17 through 25 are views for illustrating a method of manufacturing a semiconductor device according to an eighth preferred embodiment. Below, the method of manufacturing a semiconductor device according to the eighth preferred embodiment will be described.

Figure 17:
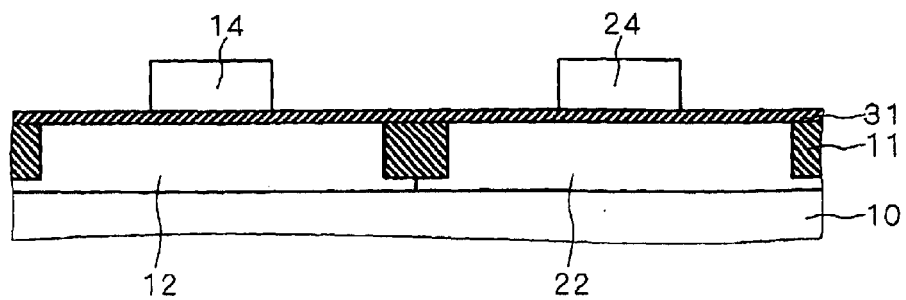
FIG. 17 is a diagrammatical view illustrating a section of a MOS transistor in a semiconductor device according to an eighth preferred embodiment of the present invention, which is taken along a direction of a channel length of the MOS transistor.

First, the isolation film 11, the p-well 12, the n-well 22, the silicon oxide film 31 as a material for forming a gate insulating film and the gate electrodes 14 and 24 are formed on the silicon substrate 10 in the same manner as in the first preferred embodiment (FIG. 17).

Figure 18:
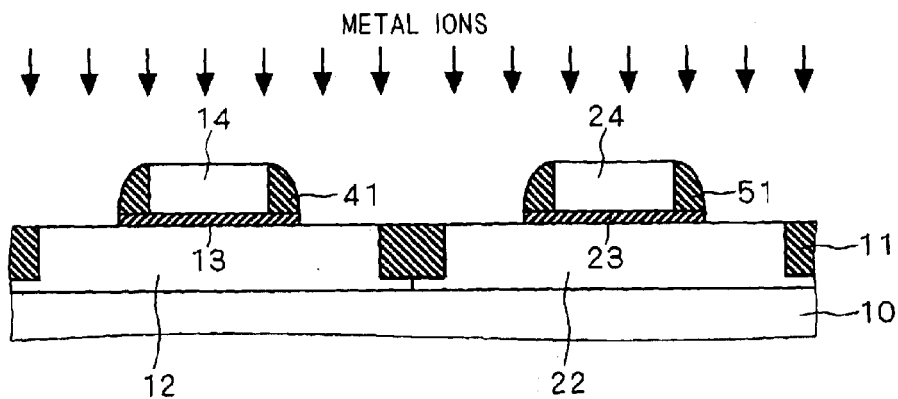
FIGS. 18 through 25 are views for illustrating a method of manufacturing a semiconductor device according to the eighth preferred embodiment of the present invention.

Next, first sidewalls 41 and 51 are formed on respective side faces of the gate electrodes 14 and 24, and the silicon oxide film 31 is etched to form the gate insulating films 13 and 23 under the gate electrodes 14 and 24, respectively. Subsequently, ion implantation using a metal as an ion species is carried out. Specifically, metal ions such as Ti ions, Co ions, Ni ions, Mo ions, Ru ions, W ions and Pt ions are implanted at a dose of $3 \times 10^{15}/cm^2$ or larger into an entire surface of the resultant structure (FIG. 18).

Figure 19:
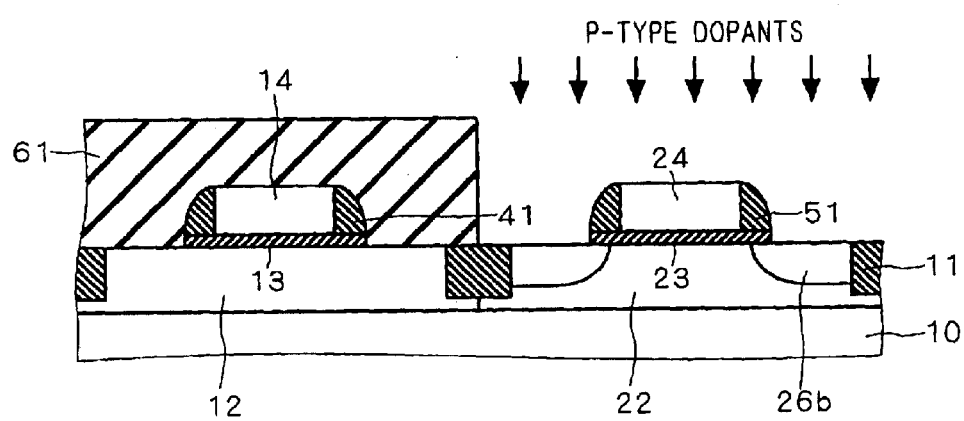

Thereafter, a resist mask 61 having an opening located in a region where a pMOS transistor is to be formed is formed. Then, implantation of B ions as p-type dopants is carried out using the resist mask 61, the gate electrode 24 and the first sidewall 51 as a mask. This implantation is carried out under process conditions that an energy is in a range from 2 keV to 5 keV, and a dose is $3 \times 10^{15}/cm^2$ or larger. As a result, the p-type source/drain diffusion layer 26b is formed at a relatively deep portion in the n-well 22 (FIG. 19).

Figure 20:
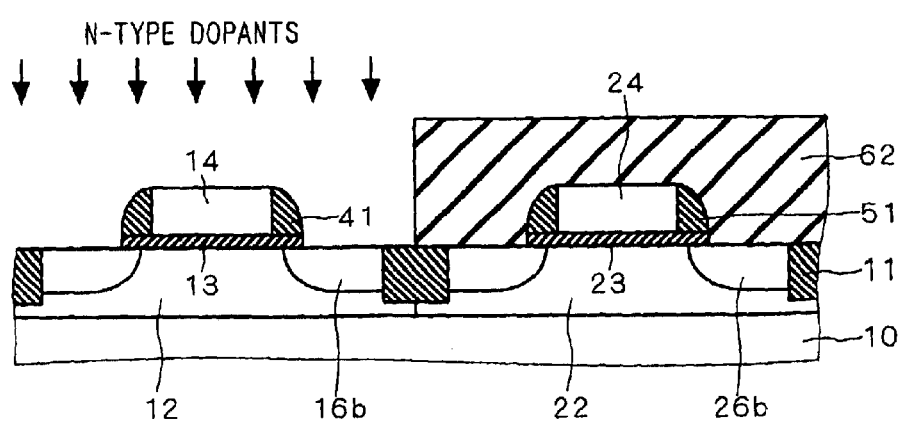

Then, a resist mask 62 having an opening located in a region where an nMOS transistor is to be formed is formed. Then, implantation of As ions as n-type dopants is carried out using the resist mask 62, the gate electrode 14 and the first sidewall 41 as a mask. This implantation is carried out under process conditions that an energy is in a range from 20 keV to 60 keV, and a dose is $3 \times 10^{15}/cm^2$ or larger. As a result, the n-type source/drain diffusion layer 16b is formed at a relatively deep portion in the p-well 12 (FIG. 20).

Annealing is carried out at a temperature of approximately 1000° C., to repair damage caused by the processes of ion implantation and to activate the dopants. During the above-described processes of ion implantation (i.e., the processes of implantation of the metal ions and ion implantation for forming the n-type source/drain diffusion layer 16b and the p-type source/drain diffusion layer 26b), ions at a dose of $6 \times 10^{15}/cm^2$ or larger are implanted into each of the gate electrodes 14 and 24 of polysilicon. Accordingly, a surface (top face) portion of each of the gate electrodes 14 and 24 into which ions are implanted expands in response to the annealing.

Figure 21:
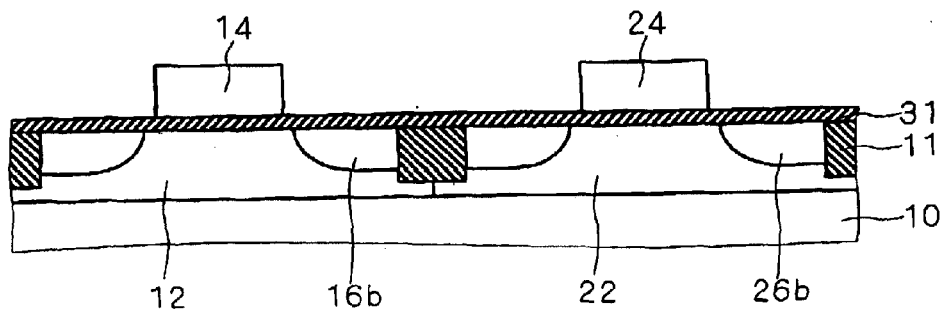

Subsequently, the first sidewalls 41 and 51 are etched to be removed as illustrated in FIG. 21. For this process of etching, a phosphoric acid treatment is performed when the first sidewalls 41 and 51 are formed of silicon nitride, while a hydrofluoric acid treatment is performed when the first sidewalls 41 and 51 are formed of silicon oxide.

Figure 22:
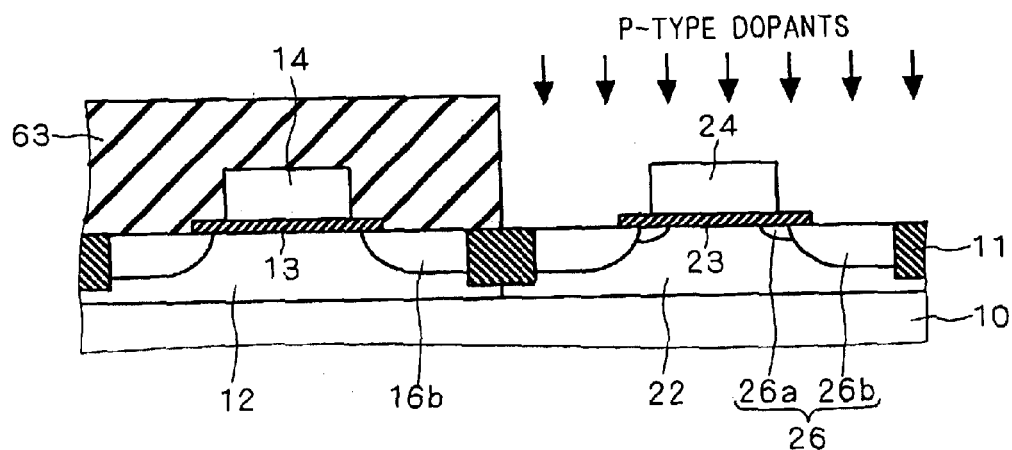

A resist mask 63 having an opening located in the region where the pMOS transistor is to be formed is formed. Then, implantation of B ions or $BF_2$ ions as p-type dopants is carried out using the resist mask 63 and the gate electrode 24 as a mask. This implantation is carried out under process conditions that an energy is in a range from 0.2 keV to 12 keV, and a dose is in a range from $1 \times 10^{14}/cm^2$ to $1 \times 10^{15}/cm^2$. As a result, the p-type source/drain extension layer 26a is formed at a relatively shallow portion in the n-well 22 (FIG. 22).

Figure 23:
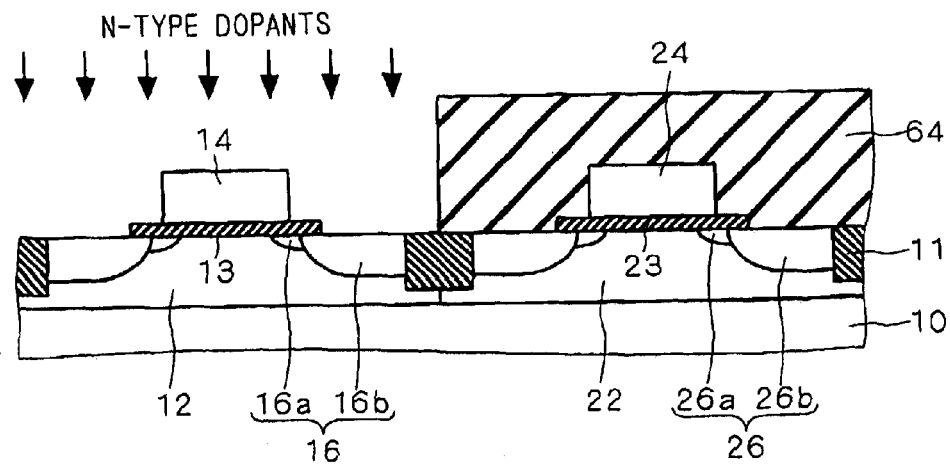

Further, a resist mask 64 having an opening located in the region where the nMOS transistor is to be formed is formed. Then, implantation of As ions as n-type dopants is carried out using the resist mask 64 and the gate electrode 14 as a mask. This implantation is carried out under process conditions that an energy is in a range from 0.5 keV to 15 keV, and a dose is in a range from $1 \times 10^{14}/cm^2$ to $2 \times 10^{15}/cm^2$. As a result, the n-type source/drain extension layer 16a is formed at a relatively shallow portion in the p-well 12 (FIG. 23).

Figure 24:
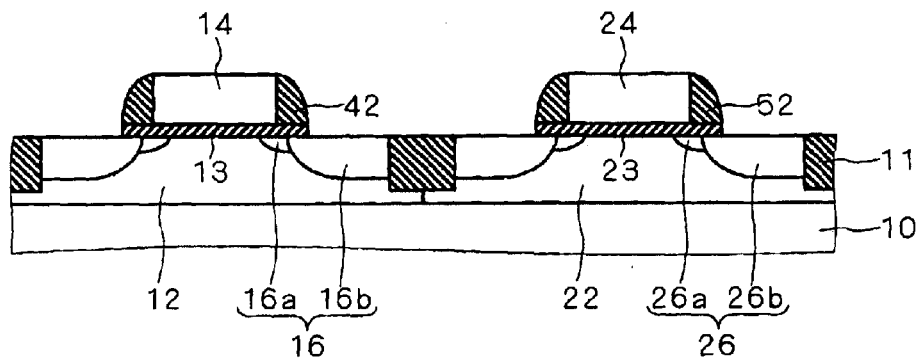

Then, second sidewalls 15 and 25 are formed on the respective side faces of the gate electrodes 14 and 24, respectively, as illustrated in FIG. 24.

Figure 25:
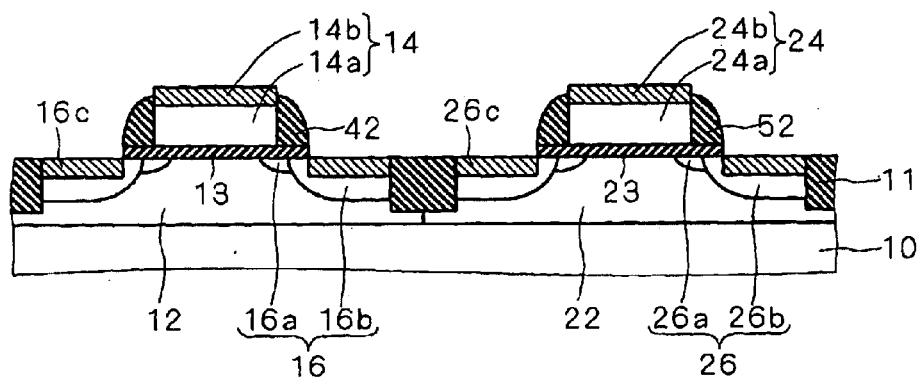

Subsequently, a silicide layer is formed in an upper portion of each of the gate electrodes 14 and 24 and the source/drain regions 16 and 26. Accordingly, the gate electrode 14 has a bilayer structure of the polysilicon layer 14a and the silicide layer 14b, while the gate electrode 24 has a bilayer structure of the polysilicon layer 24a and the silicide layer 24b. Further, the silicide layers 16c and 26c are formed in respective upper portions of the n-type source/drain region 16 and the p-type source/drain region 26, respectively (FIG. 25).

During formation of the silicide layers 14b and 24b, agglomeration of silicide (the silicide layers 14b and 24b) is prevented because the respective surface portions of the gate electrodes 14 and 24 in which the silicide layers 14b and 24b are formed have expanded. On the other hand, the respective bottom portions (i.e., the polysilicon layers 14a and 24a) of the gate electrodes 14 and 24 do not expand, and thus do not inhibit reduction of the gate length of the MOS transistor.

Thus, also according to the eighth preferred embodiment, each of the gate electrodes 14 and 24 has the same structure as the gate electrode 4 illustrated in FIGS. 1 and 2. Hence, it is possible to reduce the gate length of the MOS transistor, as well as to reduce a resistance of the gate electrode of the MOS transistor. This contributes to increase in an operation speed and improvement in operational reliability of the semiconductor device.

Further, since metal ions each have a relatively large mass number, the expansion in the upper portion of the gate electrode is promoted. This enhances the effect of preventing agglomeration of silicide. Moreover, metal atoms of the metal ions, combined with silicon, form a compound, which contributes to reduction of a resistance of the gate electrode. In addition, since the first sidewalls into which the metal ions are implanted are removed, it is possible to prevent a short-circuit from being formed between the source/drain regions and the gate electrodes due to siliciding of the surfaces of the sidewalls.

Furthermore, according to the eighth preferred embodiment, the processes of ion implantation for forming the n-type source/drain extension layer 16a and the p-type source/drain extension layer 26a are carried out after the process of annealing for repairing damages caused due to the processes of ion implantation and activating the dopants. Accordingly, the n-type source/drain extension layer 16a and the p-type source/drain extension layer 26a are not subjected to the process of annealing during which the device under manufacture has the highest temperature in the entire manufacture. This makes it possible to form the source/drain extension layers 16a and 26a in shallower portions, which suppresses a short channel effect of the MOS transistor.

Ninth Preferred Embodiment

According to the conventional practices, P ions each having a relatively large mass number and B ions each having a relatively small mass number are typically used as n-type dopants and p-type dopants, respectively, in a method of manufacturing a semiconductor device. On the other hand, increase in mass number of each ion to be implanted into polysilicon enhances the effects brought by the present invention as described above. As such, in a situation where P ions and B ions are used as n-type dopants and p-type dopants, respectively, the present invention can exhibit its effects more significantly on manufacture of an n-channel MOS transistor. Thus, in the above-noted situation, the present invention may be applied only to manufacture of an n-channel MOS transistor for the purpose of facilitating an entire manufacture.

Below, a method of manufacturing a semiconductor device according to a ninth preferred embodiment will be described. First, the isolation film 11, the p-well 12 and the n-well 22 are formed on the silicon substrate 10, on which the silicon oxide film 31 and the polysilicon film 32 are then formed, in the same manner as in the first preferred embodiment (FIG. 3).

Figure 26:
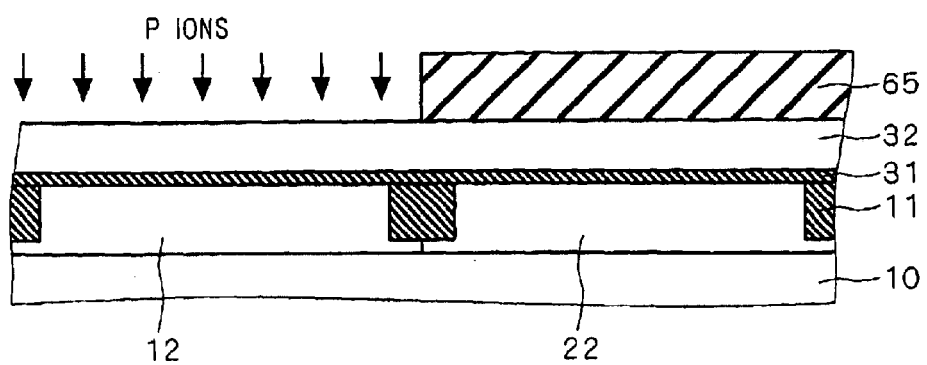
FIGS. 26 and 27 are views for illustrating a method of manufacturing a semiconductor device according to a ninth preferred embodiment of the present invention.

Next, a resist mask 65 having an opening located in a region where an n-channel MOS transistor is to be formed, and P ions are implanted at a dose of $6 \times 10^{15}/cm^2$ or larger using the resist mask 65, as illustrated in FIG. 26.

Figure 27:
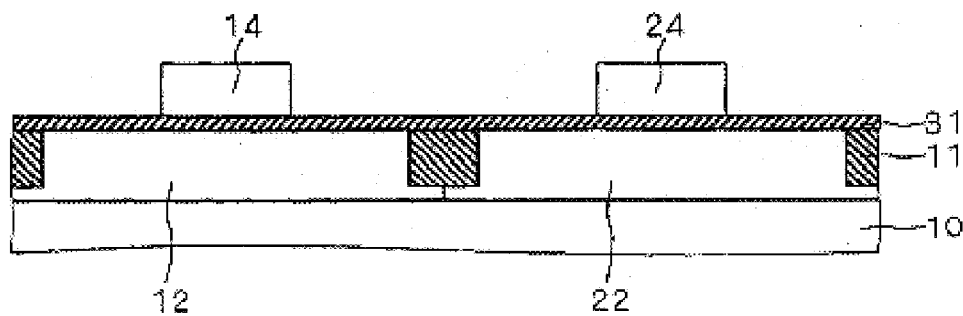
Figure 28:
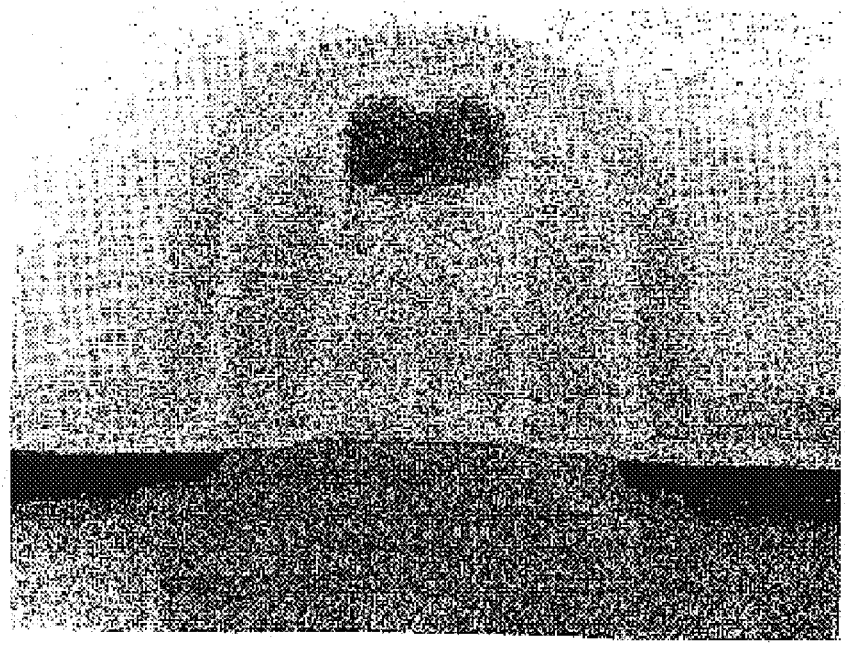
FIG. 28 is a copy of a photograph of a section of a MOS transistor in a conventional semiconductor device, which is taken along a direction of a channel length of the MOS transistor.

Then, the resist mask 65 is removed, and the polysilicon film 32 is patterned, to form the gate electrodes 14 and 24 on the p-well 12 and the n-well 22, respectively (FIG. 27).

Processes to be performed thereafter are identical to those described in the first preferred embodiment with reference to FIGS. 4 through 10, and thus will be omitted in the ninth preferred embodiment. As a result, the gate electrode 14 of the n-channel MOS transistor has the same structure as the gate electrode 4 illustrated in FIGS. 1 and 2. Hence, it is possible to reduce the gate length of the MOS transistor, as well as to reduce a resistance of the gate electrode of the MOS transistor. This contributes to increase in an operation speed and improvement in operational reliability of the semiconductor device.

Further, by implanting P ions at a high concentration into polysilicon of the gate electrode of the n-channel MOS transistor, it is possible to suppress depletion of the gate electrode, to improve a current drive capability.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising:

forming a gate insulating film on a semiconductor substrate and forming a polysilicon layer on said gate insulating film;

implanting ions into said polysilicon layer;

patterning said polysilicon layer to form a gate electrode;

annealing said gate electrode; and siliciding an upper portion of said gate electrode to form a silicide layer that has a lower portion facing said gate electrode and an upper portion opposite to said lower portion, said upper portion of said silicide layer being wider than said lower portion, wherein a total dose of said ions to be implanted in said implanting is $6 \times 10^{15}/cm^2$ or larger.

2. The method of manufacturing a semiconductor device according to claim 1, wherein said ions to be implanted in said implanting include an ion having a mass number of 70 or larger.

3. The method of manufacturing a semiconductor device according to claim 1, wherein said ions to be implanted in said implanting include an electrically inactive ion.

4. The method of manufacturing a semiconductor device according to claim 1, wherein said implanting includes ion implantation using a metal as an ion species.

5. The method of manufacturing a semiconductor device according to claim 1, wherein said implanting includes the forming a source/drain region in said semiconductor substrate by ion implantation using said gate electrode as a mask, and said forming a source/drain region being performed after said patterning.

6. The method of manufacturing a semiconductor device according to claim 5, wherein said implanting includes implanting ions into an entire surface of said polysilicon layer, said implanting ions into an entire surface being performed before said patterning.

7. The method of manufacturing a semiconductor device according to claim 5, further comprising:

forming a sidewall on a side face of said gate electrode, wherein said forming a source/drain region includes:

carrying out a first ion implantation using said gate electrode as a mask, before said forming a sidewall; and carrying out a second ion implantation using said gate electrode and said sidewall as a mask, after said forming a sidewall.

8. The method of manufacturing a semiconductor device according to claim 7, wherein said implanting further includes carrying out a third ion implantation using a metal as an ion species, on said gate electrode and said sidewall, said carrying out a third ion implantation being performed after said forming a sidewall, and said method further comprising:

etching a surface of said sidewall after said carrying out a third ion implantation.

9. The method of manufacturing a semiconductor device according to claim 5, further comprising:

forming a first sidewall on a side face of said gate electrode;

removing said first sidewall; and forming a second sidewall on said side face of said gate electrode after said removing said first sidewall, wherein said implanting further includes carrying out a first ion implantation using a metal as an ion species, on said gate electrode and said first sidewall, said carrying out a first ion implantation being performed between said forming a first sidewall and said removing said first sidewall.

10. The method of manufacturing a semiconductor device according to claim 9, wherein said forming a source/drain region includes carrying out a second ion implantation using said gate electrode and said first sidewall as a mask, between said forming a first sidewall and said removing said first sidewall; and carrying out a third ion implantation using said gate electrode as a mask, between said removing said first sidewall and said forming a second sidewall and after said annealing.

11. A method of manufacturing a semiconductor device including a p-channel MOS transistor and an n-channel MOS transistor, comprising:

forming a gate insulating film on a semiconductor substrate, and forming a polysilicon layer on said gate insulating film;

implanting phosphorus ions into an entire surface of said polysilicon layer except a region where said p-channel MOS transistor is to be formed;

patterning said polysilicon layer to form respective gate electrodes of said p-channel MOS transistor and said n-channel MOS transistor, said patterning being performed after said implanting;

forming a source/drain region of said n-channel MOS transistor in said semiconductor substrate by ion implantation using said gate electrode of said n-channel MOS transistor as a mask;

forming a source/drain region of said p-channel MOS transistor in said semiconductor substrate by another ion implantation using said gate electrode of said p-channel MOS transistor as a mask;

annealing said respective gate electrodes of said p-channel MOS transistor and said n-channel MOS transistor; and siliciding an upper portion of each of said respective gate electrodes of said p-channel MOS transistor and said n-channel MOS transistor to form corresponding silicide layers, each suicide layer having (i) a lower portion facing a corresponding gate electrode and (ii) an upper portion opposite to said lower portion, at least one suicide layer having an upper portion wider than a corresponding lower portion, wherein a total dose of ions implanted in said implanting and forming a source/drain region is $6 \times 10^{15}/cm^2$ or larger.

* * * * *